United States Patent
Imai

(10) Patent No.: US 7,180,168 B2
(45) Date of Patent: Feb. 20, 2007

(54) STACKED SEMICONDUCTOR CHIPS

(75) Inventor: Takahiro Imai, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/222,330

(22) Filed: Sep. 7, 2005

(65) Prior Publication Data

US 2006/0008974 A1   Jan. 12, 2006

Related U.S. Application Data

(62) Division of application No. 10/661,372, filed on Sep. 12, 2003, now Pat. No. 7,005,324.

(30) Foreign Application Priority Data

Sep. 24, 2002   (JP) .............................. 2002-277454

(51) Int. Cl.
H01L 23/02 (2006.01)
H01L 23/48 (2006.01)

(52) U.S. Cl. ..................... 257/686; 257/776; 257/777; 257/E23.019; 257/E23.143; 257/E23.151; 257/E23.01

(58) Field of Classification Search ................. None
See application file for complete search history.

(56) References Cited

U.S. PATENT DOCUMENTS

| | | | |
|---|---|---|---|
| 4,249,299 A * | 2/1981 | Stephens et al. ............ 438/666 |
| 5,268,326 A | 12/1993 | Lesk et al. .................. 438/406 |
| 5,347,159 A * | 9/1994 | Khandros et al. ........... 257/692 |
| 5,394,303 A * | 2/1995 | Yamaji ....................... 361/749 |
| 5,397,916 A * | 3/1995 | Normington ................ 257/686 |
| 5,517,057 A | 5/1996 | Beilstein et al. ............ 257/686 |
| 5,571,754 A | 11/1996 | Bertin et al. ................ 438/109 |
| 5,648,684 A | 7/1997 | Beretin et al. .............. 257/685 |
| 5,714,405 A * | 2/1998 | Tsubosaki et al. .......... 438/118 |
| 5,973,392 A | 10/1999 | Senba et al. ................ 257/686 |
| 6,002,167 A * | 12/1999 | Hatano et al. .............. 257/696 |
| 6,150,726 A * | 11/2000 | Feilchenfeld et al. ....... 257/784 |
| 6,184,060 B1 | 2/2001 | Siniaguin .................... 438/106 |
| 6,329,708 B1 * | 12/2001 | Komiyama .................. 257/678 |
| 6,376,769 B1 * | 4/2002 | Chung ........................ 174/52.2 |
| 6,720,661 B2 * | 4/2004 | Hanaoka et al. ............ 257/774 |
| 6,730,596 B1 | 5/2004 | Fukunaga et al. .......... 438/660 |
| 6,841,849 B2 | 1/2005 | Miyazawa ................... 257/621 |

(Continued)

FOREIGN PATENT DOCUMENTS

| JP | 60-160645 | 8/1985 |
| JP | 02-257652 | 10/1990 |
| JP | 08-125077 | 5/1996 |
| WO | WO 9819337 | 5/1998 |

*Primary Examiner*—Alonzo Chambliss
(74) *Attorney, Agent, or Firm*—Hogan & Hartson LLP

(57) ABSTRACT

A groove is formed on a semiconductor substrate having integrated circuits and electrodes from a first surface. An insulating layer is formed on an inner surface of the groove. A conductive layer is formed on the insulating layer above the inner surface of the groove. A second surface of the semiconductor substrate opposite to the first surface is ground until the groove is exposed to divide the semiconductor substrate into a plurality of semiconductor chips in which the conductive layer is exposed on a side surface of each semiconductor chip. The semiconductor chips are then stacked. The conductive layer of one of the semiconductor chips is electrically connected to the conductive layer of another one of the semiconductor chips.

4 Claims, 10 Drawing Sheets

U.S. PATENT DOCUMENTS 7,005,324 B2 * 2/2006 Imai .......................... 438/113

2004/0155355 A1 * 8/2004 Hanaoka et al. ............ 257/777

* cited by examiner

STACKED SEMICONDUCTOR CHIPS

This is a divisional of application Ser. No. 10/661,372 filed Sep. 12, 2003, now U.S. Pat. No. 7,005,324, which application is hereby incorporated by reference in its entirety.

Japanese Patent Application No. 2002-277454, filed on Sep. 24, 2002, is hereby incorporated by reference in its entirety.

BACKGROUND OF THE INVENTION

The present invention relates to a semiconductor device, a method of manufacturing the semiconductor device, a circuit board, and an electronic instrument.

A semiconductor device in three-dimensional mounting form has been developed. It is known in the art that electrical connection in the vertical direction is achieved by using wires. However, since the wires must be bonded to electrodes of each semiconductor chip, manufacturing steps become complicated in the case of stacking a number of semiconductor chips. Moreover, since the wire bonding regions must be exposed, the external shape of the semiconductor chip and the position of the electrodes are limited.

It is also known in the art that insulating layers are formed inside through holes formed in the semiconductor chip, and conductive electrodes are formed inside the through holes. In this case, it is difficult to form the insulating layers inside the small through holes and to form the conductive electrodes inside the through holes. Moreover, since it is necessary to design the integrated circuit so as to avoid the through holes, the degree of limitations to the design is increased.

BRIEF SUMMARY OF THE INVENTION

According to a first aspect of the present invention, there is provided a method of manufacturing a semiconductor device comprising:

(a) forming a groove on a first surface of a semiconductor substrate, a plurality of integrated circuits and electrodes being formed on the first surface;

(b) forming an insulating layer on an inner surface of the groove;

(c) forming a first conductive layer on the insulating layer on the inner surface of the groove;

(d) grinding a second surface of the semiconductor substrate opposite to the first surface until the groove is exposed to divide the semiconductor substrate into a plurality of semiconductor chips each of which has a first conductive layer exposed on a side surface of each of the semiconductor chips;

(e) stacking the semiconductor chips; and (f) electrically connecting the first conductive layer of one of the semiconductor chips with the first conductive layer of another one of the semiconductor chips.

According to a second aspect of the present invention, there is provided a semiconductor device manufactured by the above method.

According to a third aspect of the present invention, there is provided a semiconductor device comprising:

a plurality of stacked semiconductor chips, each of which has a first surface on which an integrated circuit and electrodes are formed;

an insulating layer continuously formed from the first surface to a side surface of each of the semiconductor chips;

a first conductive layer formed on the insulating layer on the side surface of each of the semiconductor chips; and a second conductive layer electrically connecting the first conductive layer of one of the semiconductor chips to the first conductive layer of another one of the semiconductor chips, wherein part of the side surface of each of the semiconductor chips is covered only by the insulating layer; and wherein the second conductive layer is formed on the side surface of at least one of the semiconductor chips.

According to a fourth aspect of the present invention, there is provided a circuit board on which is mounted the above semiconductor device.

According to a fifth aspect of the present invention, there is provided an electronic instrument comprising the above semiconductor device.

DETAILED DESCRIPTION OF THE EMBODIMENT

Figure 1:
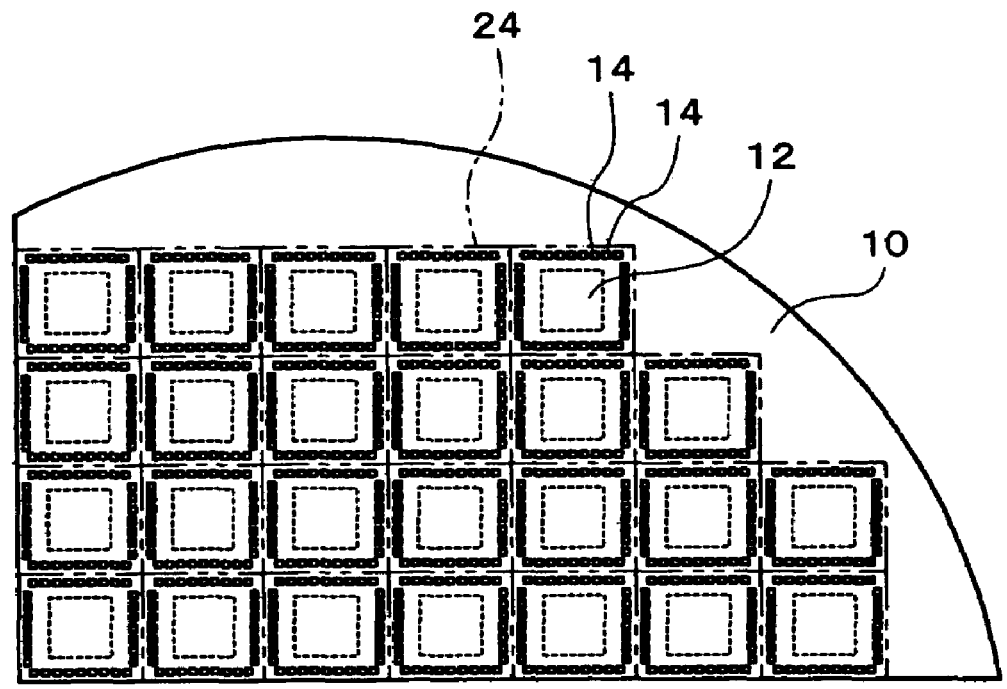
FIG. 1 is a diagram showing a part of a semiconductor substrate used in one embodiment of the present invention.

The embodiments of the present invention may provide a simplified method of manufacturing a thin and highly integrated semiconductor device.

(1) According to one embodiment of the present invention, there is provided a method of manufacturing a semiconductor device comprising:

(a) forming a groove on a first surface of a semiconductor substrate, a plurality of integrated circuits and electrodes being formed on the first surface;

(b) forming an insulating layer on an inner surface of the groove;

(c) forming a first conductive layer on the insulating layer on the inner surface of the groove;

(d) grinding a second surface of the semiconductor substrate opposite to the first surface until the groove is exposed to divide the semiconductor substrate into a plurality of semiconductor chips each of which has a first conductive layer exposed on a side surface of each of the semiconductor chips;

(e) stacking the semiconductor chips; and (f) electrically connecting the first conductive layer of one of the semiconductor chips with the first conductive layer of another one of the semiconductor chips.

The stacked semiconductor chips are electrically connected by the first conductive layer formed on the side surface of the semiconductor chips. Since the conductive layers can be formed at the same time in a state of the semiconductor substrate, the manufacturing steps can be simplified. Moreover, since the conductive layer is not covered by another semiconductor chip, a semiconductor device having high degrees of freedom relating to the design can be manufactured without being restricted by the external shape of the semiconductor chip and location of the electrodes.

(2) In this method of manufacturing a semiconductor device, the insulating layer may be continuously formed from the inner surface of the groove to the first surface in the step (b).

This enables to cover corners of the semiconductor chip with the insulating layer. Since the corners are protected by the insulating layer, occurrence and progress of chipping can be reduced, and elements and interconnects of the integrated circuits formed on the first surface can be prevented from being removed.

(3) In this method of manufacturing a semiconductor device, the first conductive layer may be continuously formed from the inner surface of the groove to the first surface in the step (c).

The first conductive layer may be formed as an interconnect.

(4) In this method of manufacturing a semiconductor device, the first conductive layer may be electrically connected to one of the electrodes in the step (c).

(5) In this method of manufacturing a semiconductor device, the semiconductor chips may be stacked so that the first surfaces of the semiconductor chips on which the electrodes are formed are oriented to the same direction in the step (e).

(6) In this method of manufacturing a semiconductor device, the semiconductor chips may be stacked so that the first surface of one of the semiconductor chips on which the electrodes are formed is oriented opposite to the first surface of another one of the semiconductor chips on which the electrodes are formed in the step (e).

(7) In this method of manufacturing a semiconductor device, the step (e) may include providing at least one insulator between the semiconductor chips.

This makes it possible to prevent occurrence of a short circuit between the semiconductor chips.

(8) In this method of manufacturing a semiconductor device, the insulator may project from side surfaces of the semiconductor chips in the step (e).

This prevents occurrence of a short circuit between the first conductive layers disposed on both sides of the insulator by this projecting portion of the insulator.

(9) In this method of manufacturing a semiconductor device, the step (f) may include forming a second conductive layer which electrically connects the first conductive layers on a side surface of at least one of the semiconductor chips.

Since the second conductive layer is formed on the side surface of the semiconductor chip, an extremely thin semiconductor device can be manufactured without increasing the interval between the semiconductor chips.

(10) In this method of manufacturing a semiconductor device, the second conductive layer may be extended in a direction perpendicular to the semiconductor chip in order to electrically connect the first conductive layers of the semiconductor chips which are stacked straight in the step (f).

(11) In this method of manufacturing a semiconductor device, the second conductive layer may have a portion extending in a direction parallel to the semiconductor chips in order to electrically connect the first conductive layers of the semiconductor chips which are irregularly stacked in the step (f).

This enables a semiconductor device having higher degrees of freedom relating to the design to be manufactured.

(12) In this method of manufacturing a semiconductor device, a part of the second conductive layer may be formed on the projecting portion of the insulator.

This enables to prevent occurrence of a short circuit between the second conductive layer and other components.

(13) In this method of manufacturing a semiconductor device, the second conductive layer may be formed of a solder in the step (f).

(14) In this method of manufacturing a semiconductor device, the second conductive layer may be formed by supplying a solvent containing conductive particles in the step (f).

For example, a plurality of the second conductive layers can be formed at the same time by supplying the solvent.

(15) This method of manufacturing a semiconductor device may further comprise, at least after the step (d):

(g) mounting the semiconductor chips on a substrate; and (h) electrically connecting the semiconductor chips to an interconnecting pattern of the substrate.

(16) In this method of manufacturing a semiconductor device, the steps (e) and (g) may be performed before the steps (f) and (h).

In this case, the electrical connection step is performed after stacking the semiconductor chips and mounting the stacked semiconductor chips on the substrate. Specifically, by performing each of the assembling step and the electric connection step once to manufacture a semiconductor device, the manufacturing steps can be extremely simplified.

(17) In this method of manufacturing a semiconductor device, a solder may be used to electrically connect the first conductive layers to the interconnecting pattern in the step (h).

(18) In this method of manufacturing a semiconductor device, the first conductive layers may be electrically connected to the interconnecting pattern by supplying a solvent containing conductive particles in the step (h).

For example, a plurality of the conductive layers can be electrically connected to the interconnecting pattern at the same time by supplying the solvent.

(19) According to another embodiment of the present invention, there is provided a semiconductor device manufactured by the above-described method.

(20) According to further embodiment of the present invention, there is provided a semiconductor device comprising:

a plurality of stacked semiconductor chips, each of which has a first surface on which an integrated circuit and electrodes are formed;

an insulating layer continuously formed from the first surface to a side surface of each of the semiconductor chips;

a first conductive layer formed on the insulating layer on the side surface of each of the semiconductor chips; and a second conductive layer electrically connecting the first conductive layer of one of the semiconductor chips to the first conductive layer of another one of the semiconductor chips, wherein part of the side surface of each of the semiconductor chips is covered only by the insulating layer; and wherein the second conductive layer is formed on the side surface of at least one of the semiconductor chips.

In this embodiment, if part of the side surface is not covered by the first conductive layer, that part is covered by the insulating layer, so the semiconductor chip can be prevented from being electrically connected with the outside in the area other than the first conductive layer. Moreover, since the first conductive layer is not covered by other semiconductor chips, a semiconductor device having high degrees of freedom relating to the design can be provided without being restricted by the external shape of the semiconductor chip and location of the electrodes. Furthermore, since the second conductive layer is formed on the side surface of the semiconductor chip, an extremely thin semiconductor device can be manufactured without increasing the interval between the semiconductor chips.

(21) In this semiconductor device, the first conductive layer may be continuously formed from the side surface of each of the semiconductor chips to the first surface.

The first conductive layer may be formed as an interconnect.

(22) In this semiconductor device, the first conductive layer may be electrically connected to one of the electrodes.

(23) In this semiconductor device, the semiconductor chips may be stacked so that the first surfaces of the semiconductor chips on which the electrodes are formed are oriented to the same direction.

(24) In this semiconductor device, the semiconductor chips may be stacked so that the first surface of one of the semiconductor chips on which the electrodes are formed is oriented opposite to the first surface of another one of the semiconductor chips on which the electrodes are formed.

(25) In this semiconductor device, at least one insulator may be provided between the semiconductor chips.

This prevents occurrence of a short circuit between the semiconductor chips.

(26) In this semiconductor device, the insulator may project from side surfaces of the semiconductor chips.

This prevents occurrence of a short circuit between the first conductive layers disposed on both sides of the insulator by this projecting portion of the insulator.

(27) In this semiconductor device, the second conductive layer may be extended in a direction perpendicular to the semiconductor chip in order to electrically connect the first conductive layers of the semiconductor chips which are stacked straight.

(28) In this semiconductor device, the second conductive layer may have a portion extending in a direction parallel to the semiconductor chips in order to electrically connect the first conductive layers of the semiconductor chips which are irregularly stacked.

This enables a semiconductor device having higher degrees of freedom relating to the design to be manufactured.

(29) In this semiconductor device, a part of the second conductive layer may be formed on the projecting portion of the insulator.

This prevents occurrence of a short circuit between the second conductive layer and other components.

(30) In this semiconductor device, the second conductive layer may be formed of a solder.

(31) In this semiconductor device, the second conductive layer may be formed by a solvent containing conductive particles.

(32) The semiconductor device may further comprise:

a substrate on which an interconnecting pattern is formed, wherein each of the semiconductor chips is mounted on the substrate and electrically connected to the interconnecting pattern by the first conductive layers.

(33) In this semiconductor device, the semiconductor chips may have approximately the same size.

(34) In this semiconductor device, one of the semiconductor chips may have a size different from a size of another one of the semiconductor chips.

(35) According to still another embodiment of the present invention, there is provided a circuit board on which is mounted the above-described semiconductor device.

(36) According to still further embodiment of the present invention, there is provided an electronic instrument comprising the above-described semiconductor device.

The embodiments of the present invention are described below with reference to the drawings. FIGS. 1 to 13 are diagrams for illustrating a method of manufacturing a semiconductor device according to one embodiment of the present invention. In this embodiment, a semiconductor substrate (silicon substrate, for example) 10 is used. The semiconductor substrate 10 may be a semiconductor wafer. FIG. 1 shows a part of a semiconductor wafer. The planar shape of the semiconductor substrate 10 is not limited. In the case where the semiconductor substrate 10 is a semiconductor wafer, the planar shape of the semiconductor substrate 10 is generally circular.

A plurality of integrated circuits (circuits including a transistor and memory, for example) 12 are formed on the semiconductor substrate 10. A plurality of electrodes (pads, for example) 14 are formed on the semiconductor substrate 10. Each of the electrodes 14 is electrically connected with the integrated circuit 12. Each of the electrodes 14 may be formed in a region which does not overlap the integrated circuit 12 (region outside the integrated circuit in FIG. 1). Each of the electrodes 14 may be formed of an aluminum-based metal or a copper-based metal. The shape of the surface of the electrode 14 is not limited, and is generally quadrilateral. In the case where the semiconductor substrate 10 is a semiconductor wafer, at least two (one group of) electrodes are formed in each region which becomes a semiconductor chip. In the example shown in FIG. 1, the electrodes 14 are arranged along four sides of the region which becomes a semiconductor chip. However, the electrodes 14 may be arranged along two sides of the region which becomes a semiconductor chip, or arranged at the center of the region which becomes a semiconductor chip.

The semiconductor substrate 10 has a first surface 20 on which the integrated circuits 12 are formed, and a second surface 22 opposite to the first surface 20. The electrodes 14 are exposed to the outside on the first surface 20.

Figure 2:
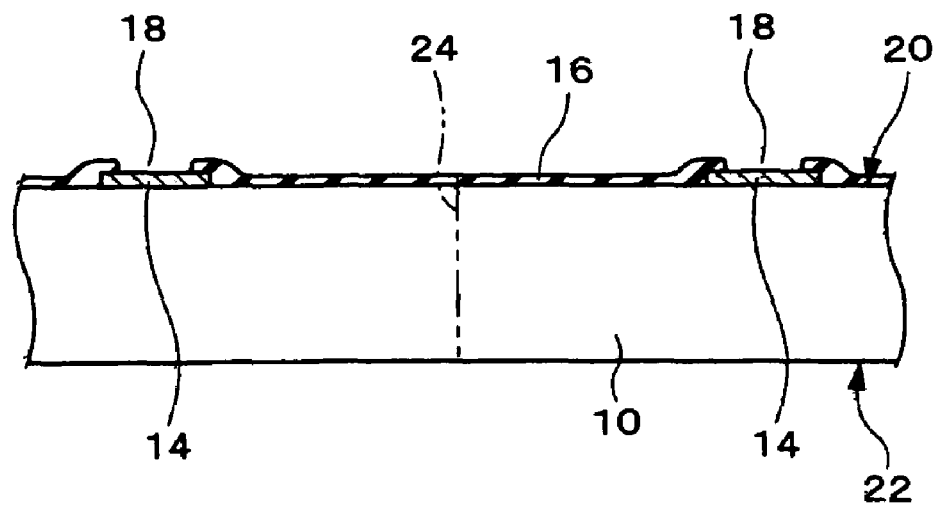
FIG. 2 is a diagram for illustrating a method of manufacturing a semiconductor device according to one embodiment of the present invention.

At least one layer of an insulating layer (second insulating layer) 16 is formed on the semiconductor substrate 10. In the example shown in FIG. 2, the insulating layer 16 is formed on the first surface 20 of the semiconductor substrate 10. The insulating layer 16 is called a passivation film and may be formed of $SiO_2$, SiN, a polyimide resin, or the like. The insulating layer 16 has openings 18 which expose at least a part of the electrodes 14. The insulating layer 16 may be formed to cover the surfaces of the electrodes 14, and a part of the electrodes 14 may be exposed by etching a part of the insulating layer 16. As shown in FIG. 2, the insulating layer 16 may be formed to allow the center of the electrodes 14 to be opened and to cover the outer circumferences of the electrodes 14.

A virtual line 24 shown in FIGS. 1 and 2 partitions the semiconductor substrate 10 into a plurality of regions (regions which become the semiconductor chips). The virtual line 24 may be formed to avoid the integrated circuits 12 and the electrodes 14. The external shape of each region (semiconductor chip) is not limited, and may be rectangular, circular, or polygonal other than rectangular.

Figure 3:
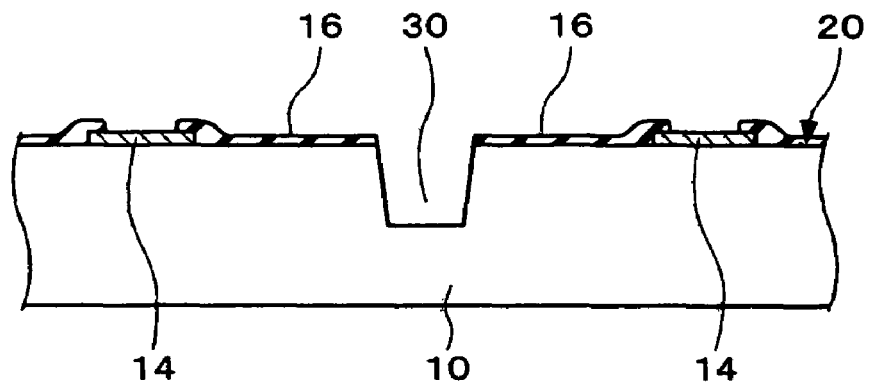
FIG. 3 is a diagram for illustrating the method of manufacturing a semiconductor device according to one embodiment of the present invention.

As shown in FIG. 3, a groove 30 is formed in the semiconductor substrate 10 from the first surface 20. In this embodiment, the groove 30 is formed along the virtual line 24. Specifically, the groove 30 is formed to partition the semiconductor substrate 10 into a plurality of regions which become the semiconductor chips. In the example shown in FIG. 3, the groove 30 is formed to avoid the integrated circuit 12 and the electrodes 14. The groove 30 may be formed mechanically by cutting the semiconductor substrate 10 by using a blade or the like. The groove 30 may be formed chemically by etching or the like, or formed optically by using a laser or the like.

The groove 30 may have a wall surface which is tapered (tapered in the direction of the opening of the groove, for example) with respect to the first surface 20. The groove 30 may have a wall surface perpendicular to the first surface 20. The groove 30 may have a bottom surface, or may be in the shape of the letter "V".

The groove 30 is formed so as not to pass through the semiconductor substrate 10. The groove 30 is formed to have a depth greater than the thickness of the semiconductor chip as a finished product. The groove 30 is formed to have a depth greater than the thickness of elements and interconnects of the integrated circuit 12 formed in the semiconductor substrate 10. A semiconductor area (silicon, for example) is exposed inside the groove 30 of the semiconductor substrate 10.

Figure 4:
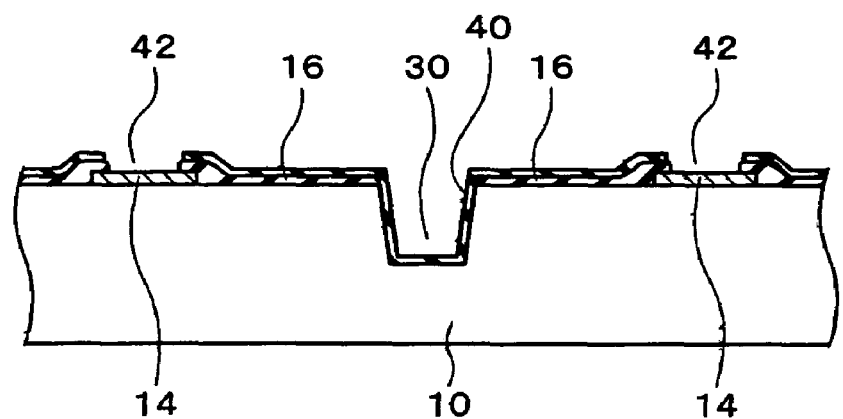
FIG. 4 is a diagram for illustrating the method of manufacturing a semiconductor device according to one embodiment of the present invention.

As shown in FIG. 4, an insulating layer 40 is formed on the semiconductor substrate 10. As a material for the insulating layer 40, an oxide film ($SiO_2$, for example), a nitride film (SiN, for example), a resin (polyimide resin, for example), and the like can be given.

The insulating layer 40 is formed on at least the inner surface of the groove 30. In the example shown in FIG. 4, the insulating layer 40 is formed on the inner wall surface and the bottom surface of the groove 30. However, the insulating layer 40 may be formed only on the inner wall surface of the groove 30. The insulating layer 40 is formed so that the groove 30 is not filled with the insulating layer 40. Specifically, a groove (or recess section) is formed by the insulating layer 40. In the example shown in FIG. 4, the entire inner surface (inner wall surface and bottom surface) of the groove 30 is covered with the insulating layer 40.

The insulating layer 40 may be continuously formed from the inner surface of the groove 30 to the first surface 20. For example, the insulating layer 40 may be formed to cover the first surface 20 of the semiconductor substrate 10 and the inner surface of the groove 30, and a necessary area may be exposed from the insulating layer 40 by etching the insulating layer 40. In the example shown in FIG. 4, openings 42 which expose the electrodes 14 are formed by etching a part of the insulating layer 40 which covers the electrodes 14.

Figure 12:
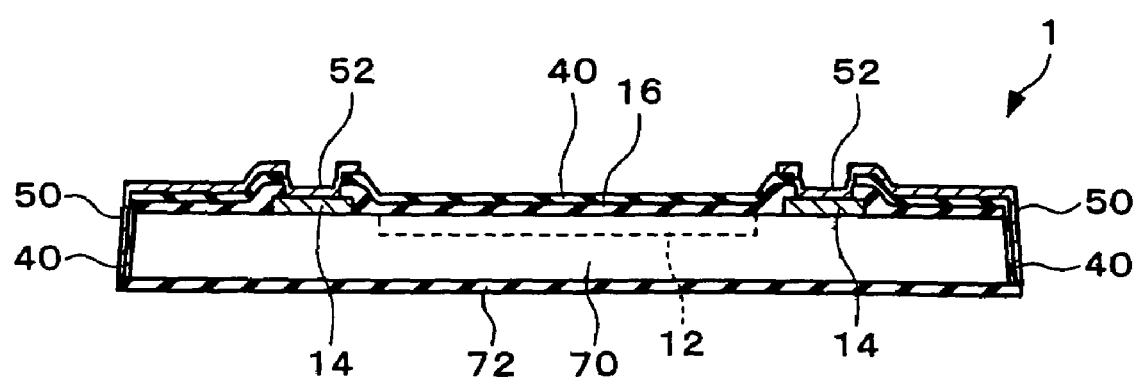
FIG. 12 is a diagram for illustrating the method of manufacturing a semiconductor device according one embodiment of the present invention.

The corners between the inner surface (inner wall surface in more detail) of the groove 30 and the first surface 20 correspond to the corners of the semiconductor chip, so the corners of the semiconductor chip can be covered by the insulating layer 40 (see FIG. 12). Therefore, since the corners of the semiconductor chip can be protected by the insulating layer, occurrence and progress of chipping can be reduced, and elements and interconnects of the integrated circuit 12 formed on the first surface 20 can be prevented from being removed.

In the case where the insulating layer (second insulating layer) 16 is formed on the first surface 20, a part of the insulating layer 40 (part on the first surface) is formed on the insulating layer (second insulating layer) 16.

Figure 5:
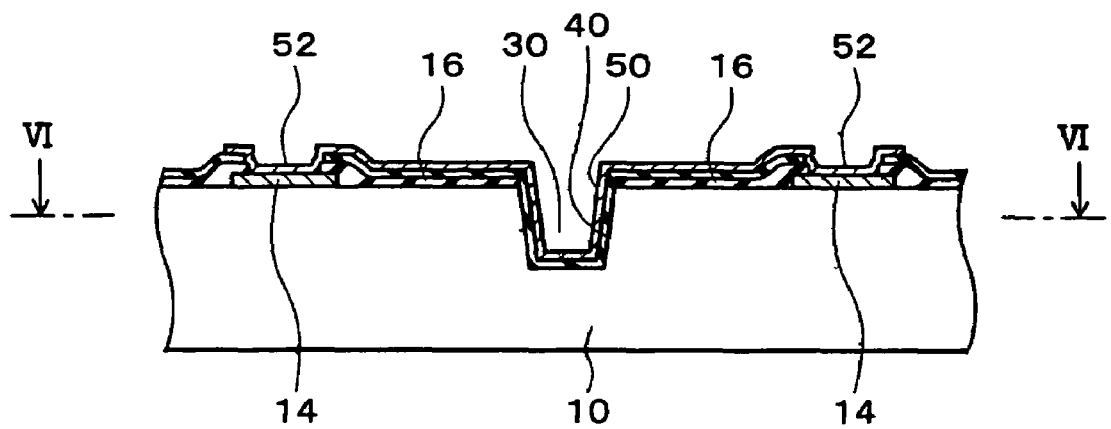
FIG. 5 is a diagram for illustrating the method of manufacturing a semiconductor device according to one embodiment of the present invention.

As shown in FIG. 5, a conductive layer 50 is formed on the semiconductor substrate 10. The conductive layer 50 may be formed by a single layer or a stacked layer of one of copper (Cu), chromium (Cr), titanium (Ti), nickel (Ni), titanium tungsten (Ti—W), gold (Au), aluminum (Al), nickel vanadium (NiV), and tungsten (W). The conductive layer 50 may be formed by performing etching after applying photolithography. The conductive layer 50 may be formed by sputtering, or by applying an additive method using electroless plating. The conductive layer 50 may be formed by using an ink-jet method. This enables the material for the conductive layer 50 to be economically provided at high speed without wasting the material by applying the technology developed for an inkjet printer.

The conductive layer 50 is formed on the insulating layer 40 on the inner surface (inner wall surface in more detail) of the groove 30. In the example shown in FIG. 5, the conductive layer 50 is formed on the inner wall surface and the bottom surface of the groove 30. However, the conductive layer 50 may be formed only on the inner wall surface of the groove 30. The conductive layer 50 is formed so that the groove 30 is not filled with the conductive layer 50. Specifically, a groove (or recess section) is formed by the conductive layer 50. Since the insulating layer 40 is present between the inner surface of the groove 30 and the conductive layer 50, the inner surface of the groove 30 is prevented from being electrically connected with the conductive layer 50.

The conductive layer 50 may be formed to extend on the inner surface of the groove 30 along the direction of the depth of the groove 30. The conductive layer 50 may be formed in the shape of a land (circular or quadrilateral). The insulating layer 40 is exposed on the inner surface of the groove 30 in the area in which the side surface is not covered with the conductive layer 50.

Figure 6:
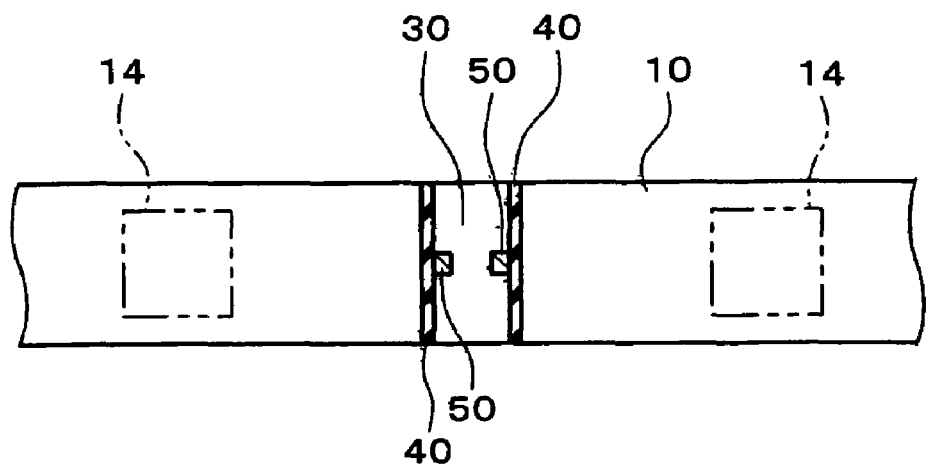
FIG. 6 is a cross-sectional view taken along the line VI—VI of FIG. 5.

FIG. 6 is a cross-sectional view taken along the line VI—VI of FIG. 5. In the example shown in FIG. 6, the conductive layer 50 is formed to project from the surface of the insulating layer 40 in the direction toward the inside of the groove 30.

Figure 7:
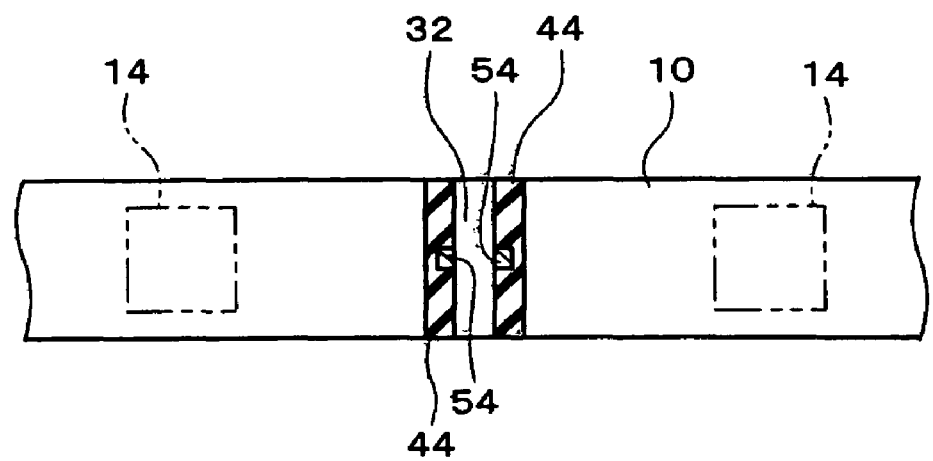
FIG. 7 is a diagram for illustrating a modification of the method of manufacturing a semiconductor device according to one embodiment of the present invention.
Figure 8:
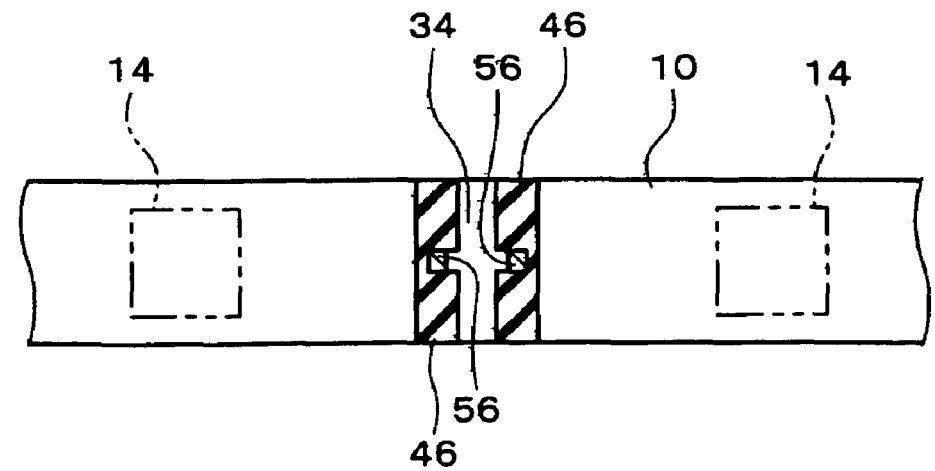
FIG. 8 is a diagram for illustrating another modification of the method of manufacturing a semiconductor device according to one embodiment of the present invention.

As a modification example, a conductive layer 54 may be formed to be level with the surface of an insulating layer 44 on the inner surface of a groove 32 as shown in FIG. 7. In this case, the conductive layer 54 is buried in the insulating layer 44. As another modification example, a conductive layer 56 may be formed to be depressed in the surface of an insulating layer 46 on the inner surface of a groove 34 as shown in FIG. 8. In this case, the conductive layer 56 is buried in the insulating layer 46. However, the conductive layer 56 is allowed to be exposed without being covered with the insulating layer 46.

According to these modification examples, since adhesion between the conductive layers 54 and 56 and the insulating layers 44 and 46 is increased, the conductive layers 54 and 56 are rarely removed from the insulating layers 44 and 46. The insulating layer may be formed to a desired thickness in the area which surrounds the conductive layer by optionally performing the formation step of the insulating layer after the formation step of the conductive layer.

As shown in FIG. 5, the conductive layer 50 may be continuously formed from the inner surface of the groove 30 to the first surface 20. Specifically, the conductive layer 50 may be formed as an interconnect which extends in the direction from the inner surface of the groove 30 to the first surface 20.

As shown in FIG. 5, the conductive layer 50 may be electrically connected with the electrodes 14. The conductive layer 50 includes connection sections 52 which extend onto the first surface 20 and are electrically connected with the electrodes 14 in the openings 18 and 42 of the insulating layers 16 and 40. The connection sections 52 may be formed to cover the electrodes 14.

As a modification example, the conductive layer 50 may not be electrically connected with the electrodes 14. Specifically, the conductive layer 50 may be formed as a dummy interconnect (interconnect which is not electrically connected with the integrated circuit).

This enables the conductive layer 50 to be formed on the side surface of the semiconductor chip. If the conductive layer 50 is electrically connected with the electrodes 14, external terminals electrically connected with the integrated circuit 12 can be easily formed on the side surface of the semiconductor chip. Therefore, the degrees of freedom of the interconnect structure on the semiconductor chip can be increased.

A step of grinding the semiconductor substrate 10 is then performed to divide the semiconductor substrate 10 into a plurality of semiconductor chips 70. In this embodiment, the semiconductor substrate 10 is ground in a state in which the semiconductor substrate 10 is retained by using a sheet 60. The sheet 60 is a retaining member for the semiconductor substrate 10.

Figure 9:
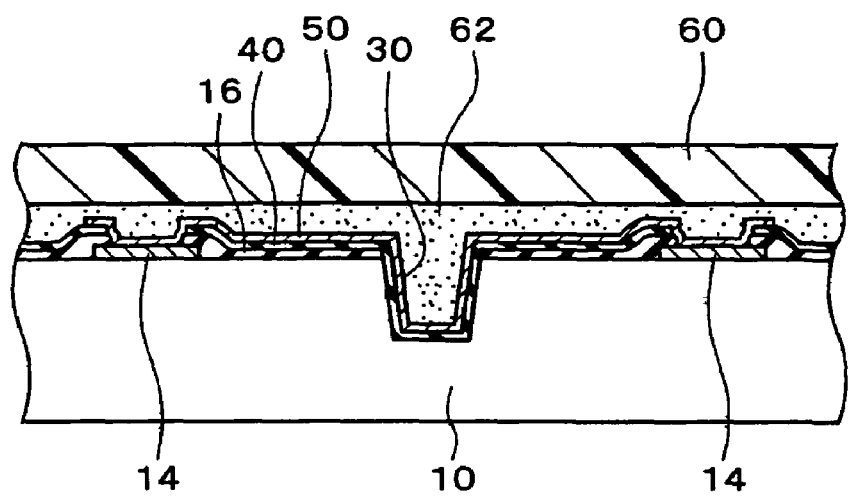
FIG. 9 is a diagram for illustrating the method of manufacturing a semiconductor device according to one embodiment of the present invention.

As shown in FIG. 9, the sheet 60 is caused to adhere to the semiconductor substrate 10 from the first surface 20. The sheet 60 retains the semiconductor substrate 10 from the first surface 20. The sheet 60 may be an adhesive material. For example, the sheet 60 may be a UV tape formed of a UV-curable resin. Since the UV tape enables adhesion of the sheet 60 to be controlled by the presence or absence of application of UV rays, the UV tape is suitable for retaining the semiconductor substrate 10 and allowing the semiconductor chip 70 to be removed from the sheet 60.

In the example shown in FIG. 9, a filler material 62 such as a resin is provided between the sheet 60 and the semiconductor substrate 10. The sheet 60 retains the semiconductor substrate 10 through the filler material 62. At least the groove 30 of the semiconductor substrate 10 is filled with the filler material 62. The filler material 62 may also be provided to the first surface 20 as shown in FIG. 9. The filler material 62 may be applied to the semiconductor substrate 10 from the first surface 20 before causing the sheet 60 to adhere to the semiconductor substrate 10. The filler material 62 may be provided to the sheet 60 in advance, and the groove 30 may be filled with the filler material 62 by causing the sheet 60 to adhere to the semiconductor substrate 10.

As a modification example, the sheet 60 may be caused to adhere to the semiconductor substrate 10 without using the filler material 62. A part of the sheet 60 may be the filler material 62.

Figure 10:
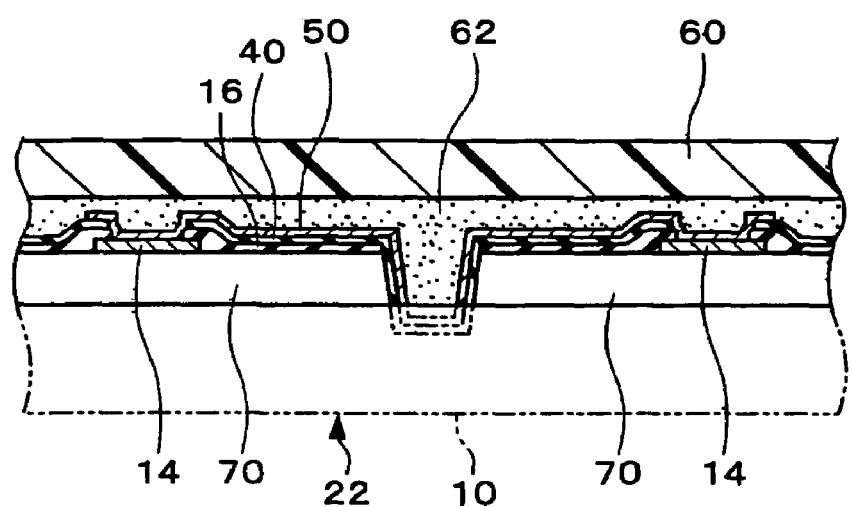
FIG. 10 is a diagram for illustrating the method of manufacturing a semiconductor device according to one embodiment of the present invention.

As shown in FIG. 10, the semiconductor substrate 10 is ground on a second surface 22. Specifically, the back surface of the semiconductor substrate 10 is polished. For example, the semiconductor substrate 10 to which the sheet 60 adheres is secured to a stage (not shown), and the semiconductor substrate 10 is mechanically ground on the second surface 22 by using a whetstone provided on a grinding jig (not shown). In this step, the semiconductor substrate 10 is ground to a thickness which allows the groove 30 to be exposed. This enables the semiconductor chip 70 to be divided into a plurality of the semiconductor chips 70, and each of the semiconductor chips 70 to be made thinner.

Since the sheet 60 adheres to the semiconductor substrate 10 on the first surface 20, the divided semiconductor chips 70 can be retained collectively. Therefore, handling of the divided semiconductor chips 70 can be facilitated.

Moreover, since the groove 30 is filled with the filler material 62 in the grinding step, powder-shaped foreign matter produced during the grinding step can be prevented from entering the groove 30. Therefore, reliability of the semiconductor device can be improved by preventing damage to the semiconductor chips 70 and adhesion of foreign matter.

Figure 11:
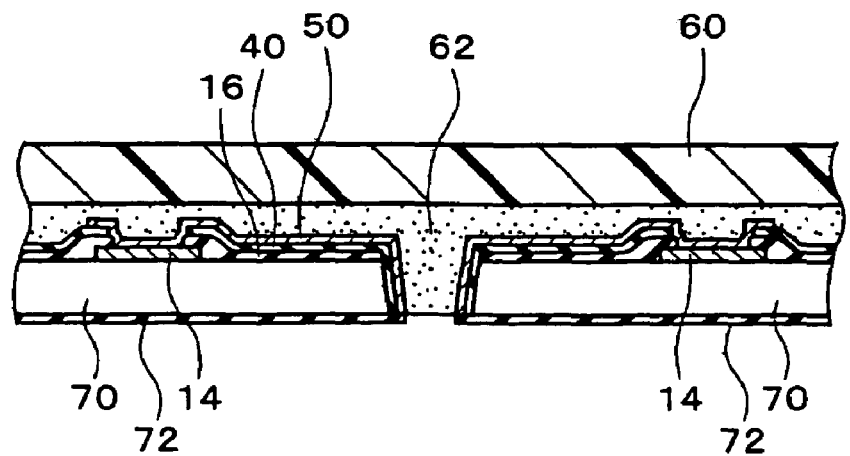
FIG. 11 is a diagram for illustrating the method of manufacturing a semiconductor device according to one embodiment of the present invention.

As shown in FIG. 11, an insulating layer (third insulating layer) 72 may be formed on the ground surfaces of the semiconductor chips 70. If the semiconductor chips 70 are retained by the sheet 60, the ground surfaces of the semiconductor chips 70 can be insulated at the same time. If the filler material 62 is provided between the semiconductor chips 70, the insulating layer 72 is formed on the entire surface of the semiconductor chips 70 including the ground surfaces, and the insulating layer 72 is removed in the area of the filler material 62. The insulating layer 72 may be formed of the same material as the insulating layer 40. The ground surface of the semiconductor chip 70 can be prevented from being electrically connected with the outside by forming the insulating layer 72. Moreover, since the entire surface of the semiconductor area (silicon, for example) of the semiconductor chip 70 can be covered with the insulating layers 16, 40, and 72, the semiconductor chip 70 can be prevented from being electrically connected with the outside in the area other than the terminal (conductive layer 50, for example).

The semiconductor chip 70 is separated from the sheet 60. In the case where the filler material 62 is provided between the semiconductor chip 70 and the sheet 60, the semiconductor chip 70 is separated from the filler material 62. For example, each of the semiconductor chips 70 is picked through the sheet 60 by using a tool (not shown). The individual pieces of semiconductor chips 70 can be obtained in this manner.

According to the above manufacturing steps, the insulating layer 40 is formed on the inner surface of the groove 30 of the semiconductor substrate 10. The inner surface of the groove 30 of the semiconductor substrate 10 corresponds to the side surfaces of the semiconductor chips 70. Therefore, the side surfaces of the semiconductor chips 70 can be insulated in the stage of the semiconductor substrate 10. Moreover, since the insulating layer 40 is formed before grinding the semiconductor substrate 10, an extremely thin semiconductor device can be manufactured while preventing occurrence of cracks and damage in the semiconductor substrate 10.

A semiconductor device 1 is manufactured by the above steps. The semiconductor device 1 includes the semiconductor chip 70 on which the integrated circuit 12 and the electrodes 14 are formed, the insulating layer 40, and the conductive layer 50. The insulating layer 40 is continuously formed from the first surface (surface on which the integrated circuit and the electrodes are formed in FIG. 12) of the semiconductor chip 70 to the side surface of the semiconductor chip 70. The insulating layer 40 preferably covers the entire side surface of the semiconductor chip 70. The conductive layer 50 is formed on the insulating layer 40 on the side surface of the semiconductor chip 70. The side surface of the semiconductor chip 70 is covered with the insulating layer 40 in the area in which the side surface is not covered with the conductive layer 50. The conductive layer 50 includes the connection section 52 electrically connected with the electrode 14. The other configuration is the same as that obtained by the above manufacturing method.

Figure 13:
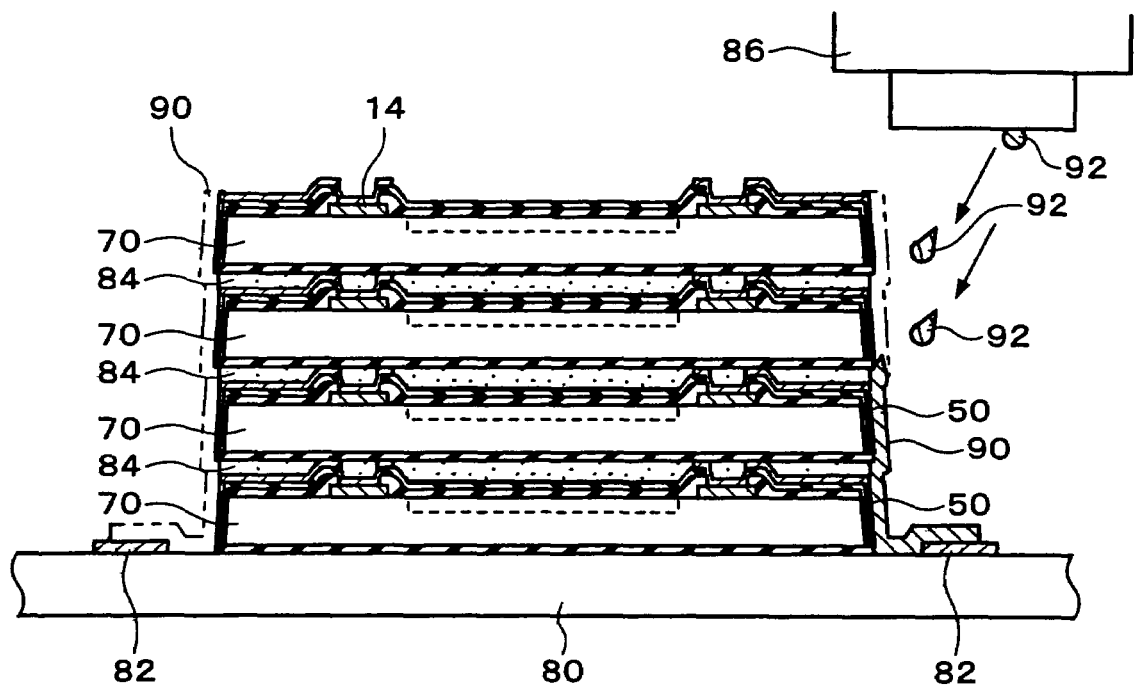
FIG. 13 is a diagram for illustrating the method of manufacturing a semiconductor device according to one embodiment of the present invention.

As shown in FIG. 13, a plurality (four in FIG. 13) of the semiconductor chips 70 (semiconductor devices 1 in more detail) are stacked. The semiconductor chip 70 is stacked on the surface of another semiconductor chip 70 on which the electrodes 14 are formed, or on the surface opposite thereto. The semiconductor chips 70 may be bonded by using an adhesive material 84. Since the semiconductor chips 70 obtained by the above manufacturing method are extremely thin, it is effective to use the semiconductor chips 70 in three-dimensional mounting form.

The semiconductor chips 70 may be stacked so that the surfaces of the semiconductor chips 70 on which the electrodes 14 are formed face in the same direction (in a direction opposite to the substrate in FIG. 13). As a modification example, the surface of one of the semiconductor chips 70 on which the electrodes 14 are formed may face in the direction which is the reverse of the direction in which the surface of the other semiconductor chip 70 on which the electrodes 14 are formed faces.

As shown in FIG. 13, the semiconductor chips 70 having approximately the same external size may be stacked. In this case, the outer circumference of each of the semiconductor chips 70 may be allowed to overlap each other. In other words, the semiconductor chips 70 may be stacked so that the entire outer circumference of each of the semiconductor chips 70 overlaps the others. The semiconductor chips 70 may be stacked so that a part of the outer circumferences of the semiconductor chips 70 overlaps.

As a modification example, the semiconductor chips 70 having different external sizes may be stacked. For example, the semiconductor chips 70 may be stacked in the order of the external size so that the entire stacked structure is in the shape of a pyramid.

As shown in FIG. 13, the semiconductor chips 70 may be mounted on a substrate 80. An interconnecting pattern 82 is formed on the substrate 80. In the example shown in FIG. 13, the substrate 80 is a circuit board (motherboard). Other electronic parts (resistors, capacitors, coils, etc.) are also mounted on the circuit board. The substrate 80 may be an interposer of the semiconductor device. In this case, external terminals (solder balls, for example) as electrical connection sections are formed on the substrate 80.

The semiconductor chips 70 may be stacked on the substrate 80, or mounted on the substrate 80 after stacking the semiconductor chips 70. As shown in FIG. 13, the semiconductor chips 70 may be mounted on the substrate 80 so that the surfaces on which the electrodes 14 are formed face in the direction opposite to the substrate 80. As a modification example, the surfaces on which the electrodes 14 are formed may face in the direction of the substrate 80.

The semiconductor chips 70 are electrically connected. In more detail, the conductive layer 50 of one of the semiconductor chips 70 is electrically connected with the conductive layer 50 of another semiconductor chip 70. This allows the semiconductor chips 70 to be electrically connected at the same time after stacking the semiconductor chips 70, whereby the manufacturing steps can be simplified.

In the case where the semiconductor chips 70 are mounted on the substrate 80, the semiconductor chips 70 are electrically connected with the interconnecting pattern 82. The semiconductor chips 70 may be electrically connected with the interconnecting pattern 82 through the conductive layers 50.

In this embodiment, the electrical connection step is performed after stacking the semiconductor chips 70 and mounting the stacked semiconductor chips 70 on the substrate 80. This enables the semiconductor device to be manufactured by performing each of the assembling step and the electric connection step once, whereby the manufacturing steps can be extremely simplified.

As shown in FIG. 13, the conductive layers 50 of the semiconductor chips 70 may be electrically connected through a second conductive layer 90. The second conductive layer 90 may be formed long and narrow as an interconnect. The second conductive layer 90 is formed on the side surface of at least one semiconductor chip 70. The second conductive layer 90 is formed to pass between the semiconductor chips 70. In this case, the second conductive layer 90 may be formed to pass on the side surface of at least one semiconductor chip 70 between the semiconductor chips 70. According to this feature, since the second conductive layer 90 is formed on the side surface of the semiconductor chip 70, an extremely thin semiconductor device can be manufactured without increasing the interval between the semiconductor chips 70.

The second conductive layer 90 may be formed by supplying a solvent 92 containing fine particles of a conductive material. In more detail, droplets of the solvent 92 are supplied from a nozzle of a droplet supply device 86. This enables a plurality of the second conductive layers 90 to be formed at the same time by supplying the solvent 92, for example. If the solvent 92 is supplied along a predetermined pattern, the second conductive layer 90 can be easily formed without wasting the solvent 92.

As a material for the solvent 92 containing fine particles of a conductive material, "Perfect Gold" and "Perfect Silver" (manufactured by Vacuum Metallurgical Co., Ltd.) may be used, for example.

The droplets of the solvent 92 may be supplied by applying an ink-jet method. In this case, the droplet supply device 86 may be an inkjet head. The ink-jet head has an electrostatic actuator structure. In more detail, the ink-jet head has a microstructure actuator formed by using a microprocessing technique of micromachining technology. The microstructure actuator utilizes static electricity as a drive source. The ink-jet head supplies the droplets of the solvent 92 from the nozzle by utilizing static electricity. This enables the material to be economically supplied at high speed without wasting the material by applying technology developed for an ink-jet printer.

The droplets of the solvent 92 may be supplied by using a dispenser. Since the dispenser is easy to handle, the second conductive layer 90 can be formed by a simplified step.

The second conductive layer 90 may be formed by using a solder (including soft solder and hard solder). The solder may be solder paste. The solder may be supplied by using the droplet supply device 86.

The conductive layer 50 of the semiconductor chip 70 may be electrically connected with the interconnecting pattern 82 by using the solvent 92 containing fine particles of a conductive material, or electrically connected with the interconnecting pattern 82 by using the solder. In this case, droplets of the solvent 92 or the solder may be supplied by the ink-jet method. If electrical connection between the semiconductor chips 70 and electrical connection between the semiconductor chip 70 and the interconnecting pattern 82 are achieved at the same time as shown in FIG. 13, the manufacturing steps can be simplified.

Figure 14:
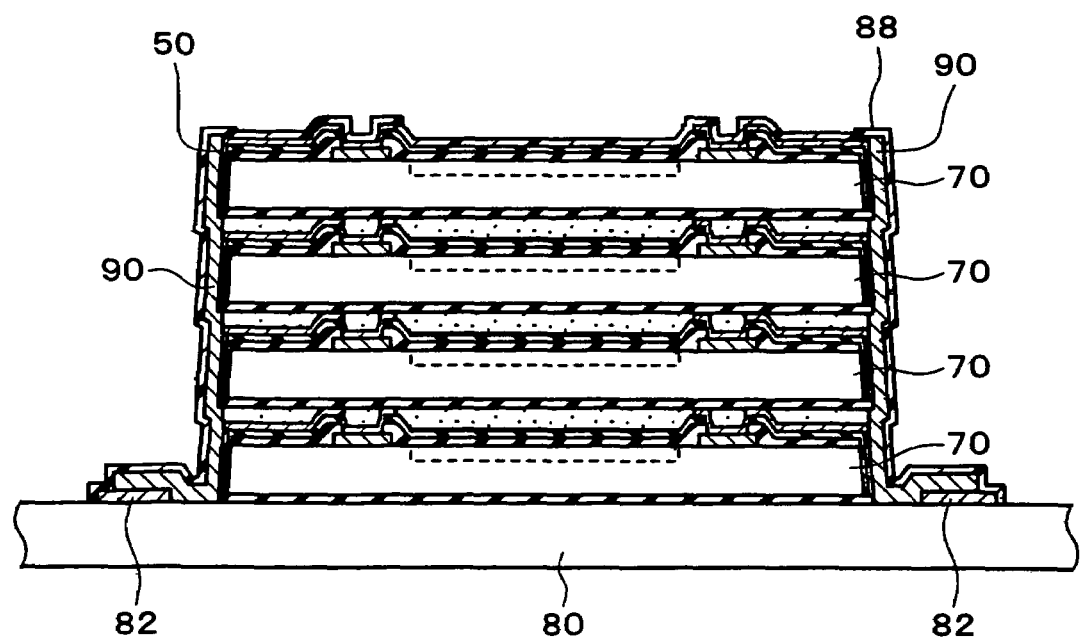
FIG. 14 is a diagram showing a semiconductor device according to one embodiment of the present invention.

As shown in FIG. 14, the conductive sections (conductive layer 50 and second conductive layer 90) exposed to the outside may be covered with a coating material 88. In the example shown in FIG. 14, the coating material 88 is a film formed of an insulating material (resin, for example).

According to the method of manufacturing a semiconductor device in this embodiment, the stacked semiconductor chips 70 are electrically connected through the conductive layers 50 formed on the side surfaces of the semiconductor chips 70. Since the conductive layers 50 can be formed at the same time in the stage of the semiconductor substrate 10, the manufacturing steps can be simplified. Since the conductive layer 50 is not covered with another semiconductor chip 70, a semiconductor device (stacked semiconductor device) having a high number of degrees of freedom relating to the design can be manufactured without being restricted by the external shape of the semiconductor chip 70 and the position of the electrode 14. Therefore, a thin and highly integrated semiconductor device can be manufactured by the simple steps.

A stacked semiconductor device can be manufactured in this manner. In FIG. 14, the semiconductor device is mounted on the circuit board. The semiconductor device includes the semiconductor chips 70 (semiconductor devices 1 in more detail (see FIG. 12)), and the second conductive layer 90. The second conductive layer 90 is formed on the side surface of at least one semiconductor chip 70. This enables the height of the bumps to be omitted, differing from the case of electrically connecting the upper and lower semiconductor chips 70 through bumps, whereby an extremely thin semiconductor device can be manufactured. In the case where the substrate 80 is an interposer, the semiconductor device further includes the substrate 80.

The semiconductor chip 70 may be a memory such as a flash memory, static random access memory (SRAM), or dynamic random access memory (DRAM), or a microprocessor such as an micro processor unit (MPU) or micro controller unit (MCU). As combinations of the semiconductor chips 70, a combination of memories (flash memory and SRAM, SRAM and SRAM, DRAM and DRAM, for example) and a combination of a memory and a microprocessor can be given.

In the case where at least two of the semiconductor chips 70 are memories, the conductive layers 50 having the same arrangement may be electrically connected through the second conductive layers 90, and data may be read from or written in memory cells of each memory at the same address. At least two of the semiconductor chips 70 may be separately controlled by using the conductive layers 50 having the same arrangement by separating the second conductive layers 90 only at connection of chip-select terminals. At least one chip select terminal may be formed on each of the four sides of the quadrilateral semiconductor chip 70, for example. If the chip select terminal is formed on each side of the semiconductor chip 70 while changing the arrangement for each side, even in the case of stacking the same design of semiconductor chips 70, the four semiconductor chips 70 can be separately controlled by rotating each semiconductor chip 70 at an angle of 90°.

The other configuration is the same as that obtained by the above manufacturing method.

According to the semiconductor device in this embodiment, since the side surface of the semiconductor chip 70 is covered with the insulating layer in the area in which the side surface is not covered with the conductive layer 50, the semiconductor chip 70 can be prevented from being electrically connected with the outside in the area other than the conductive layer 50. Moreover, since the conductive layer 50 is not covered with another semiconductor chip 70, a semiconductor device having a high number of degrees of freedom relating to the design can be provided without being restricted by the external shape of the semiconductor chip 70 and the position of the electrodes 14.

The semiconductor device according to this embodiment includes a configuration derived from any of the specific items selected from the above manufacturing method. The semiconductor device according to this embodiment has the above-described effects. The semiconductor device according to this embodiment includes a semiconductor device manufactured by a method differing from the above manufacturing method.

Modification examples of the semiconductor device (stacked semiconductor device) according to this embodiment are described below. In the following description, details which coincide with the details of other embodiments (above-described embodiment and modification examples) are omitted.

Figure 15:
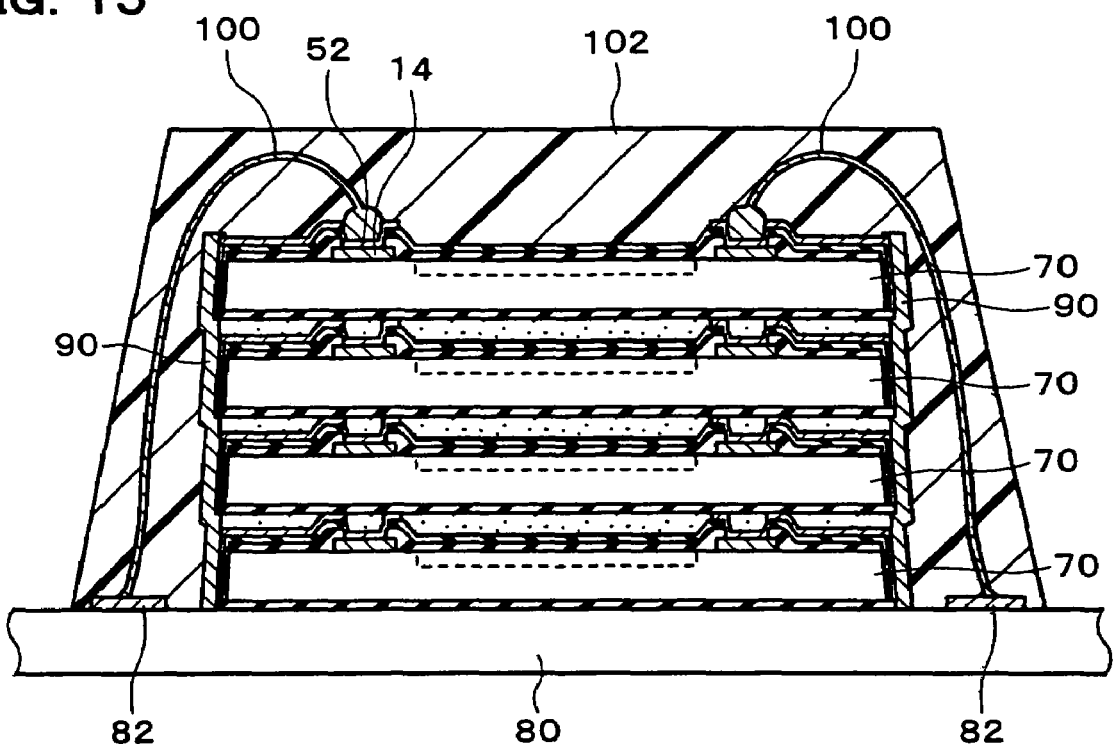
FIG. 15 is a diagram showing a first modification of the semiconductor device according to one embodiment of the present invention.

FIG. 15 is a diagram for illustrating a first modification of the semiconductor device according to this embodiment. The semiconductor device shown in FIG. 15 includes the semiconductor chips 70 (semiconductor devices 1 in more detail (see FIG. 12)), and the second conductive layer 90. One end of each wire 100 is bonded to each of the electrodes 14 (connection sections 52 of the conductive layer on the electrodes in more detail) of the semiconductor chip 70 in the uppermost layer, and the other end of the wire 100 is bonded to the interconnecting pattern 82. The semiconductor chips 70 and the wires 100 are sealed with a sealing section 102 formed of a resin or the like.

Figure 16:
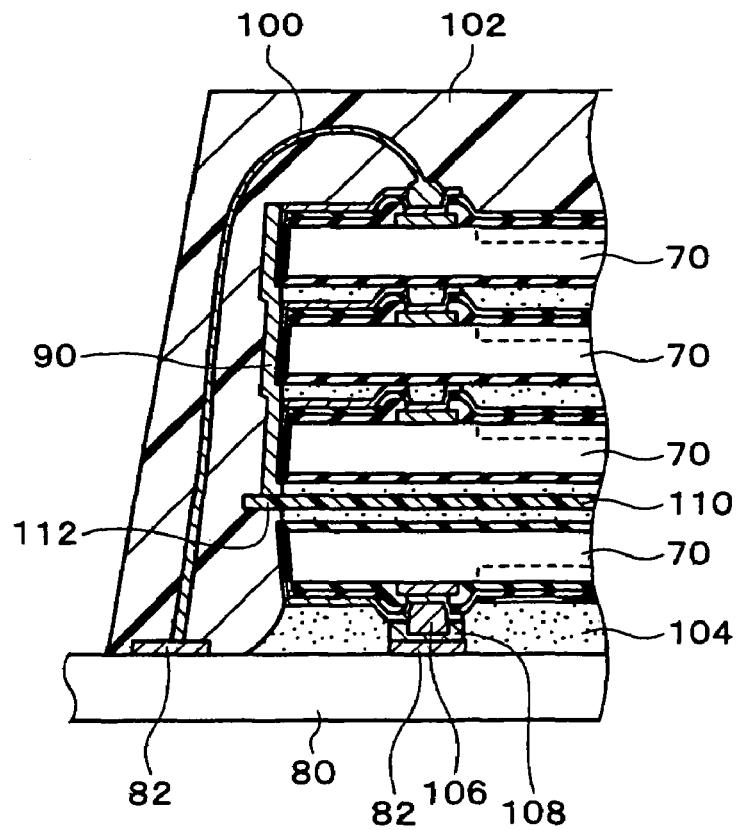
FIG. 16 is a diagram showing a second modification of the semiconductor device according to one embodiment of the present invention.

FIG. 16 is a diagram for illustrating a second modification of the semiconductor device according to this embodiment. The semiconductor device shown in FIG. 16 includes the semiconductor chips 70 (semiconductor devices 1 in more detail (see FIG. 12)), and the second conductive layer 90. The semiconductor chip 70 in the lowermost layer is mounted face down on the substrate 80. For example, bumps 106 may be provided to the electrodes 14 of the semiconductor chip 70 in the lowermost layer, and the bumps 106 may be electrically connected with the interconnecting pattern 82 through a solder 108. The bumps 106 may be electrically connected with the interconnecting pattern 82 by using a metal junction, or a junction using an anisotropic conductive material. An underfill material (resin, for example) 104 may be optionally provided between the semiconductor chip 70 in the lowermost layer and the substrate 80.

As shown in FIG. 16, the surface of at least one (upper three in FIG. 16) of the semiconductor chips 70 on which the electrodes 14 are formed may face in the direction which is the reverse of the direction in which the surface of the semiconductor chip 70 in the lowermost layer, on which the electrodes 14 are formed, faces. In the example shown in FIG. 16, one end of each of the wires 100 is bonded to one of the electrode 14 of the semiconductor chip 70 in the uppermost layer, and the other end of the wire 100 is bonded to the interconnecting pattern 82. This enables the semiconductor chips 70 in the uppermost layer and the lowermost layer to be electrically connected with the interconnecting pattern 82.

As shown in FIG. 16, an insulator 110 (insulating substrate, for example) may be provided between the semiconductor chips 70. This prevents occurrence of a short circuit between the semiconductor chips 70. The insulator 110 may overlap the entire outer circumference of the semiconductor chip 70, or overlap a part of the outer circumference of the semiconductor chip 70. As shown in FIG. 16, the insulator 110 may be provided to project from the side surface of the semiconductor chip 70. This prevents occurrence of a short circuit between the conductive layers 50 disposed on each side (upper and lower sides) of the insulator 110 by a projecting section 112 of the insulator 110. In the case of forming the second conductive layer 90 by supplying a solvent containing fine particles of a conductive material, flow of the solvent can be controlled by the projecting section 112. Therefore, occurrence of a short circuit between the conductive layers 50 can be prevented securely.

Figure 17:
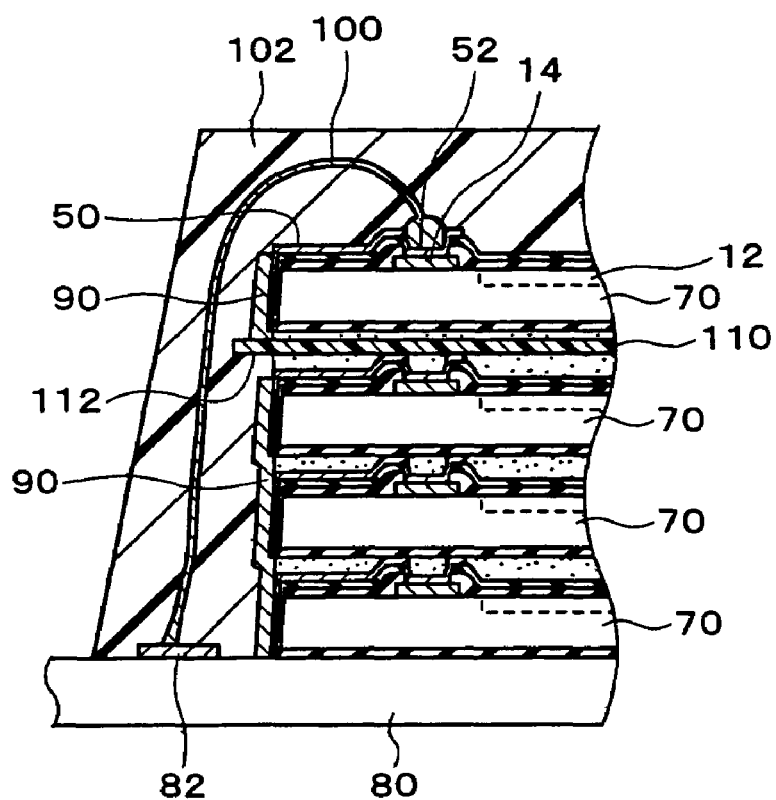
FIG. 17 is a diagram showing a third modification of the semiconductor device according to one embodiment of the present invention.
Figure 18:
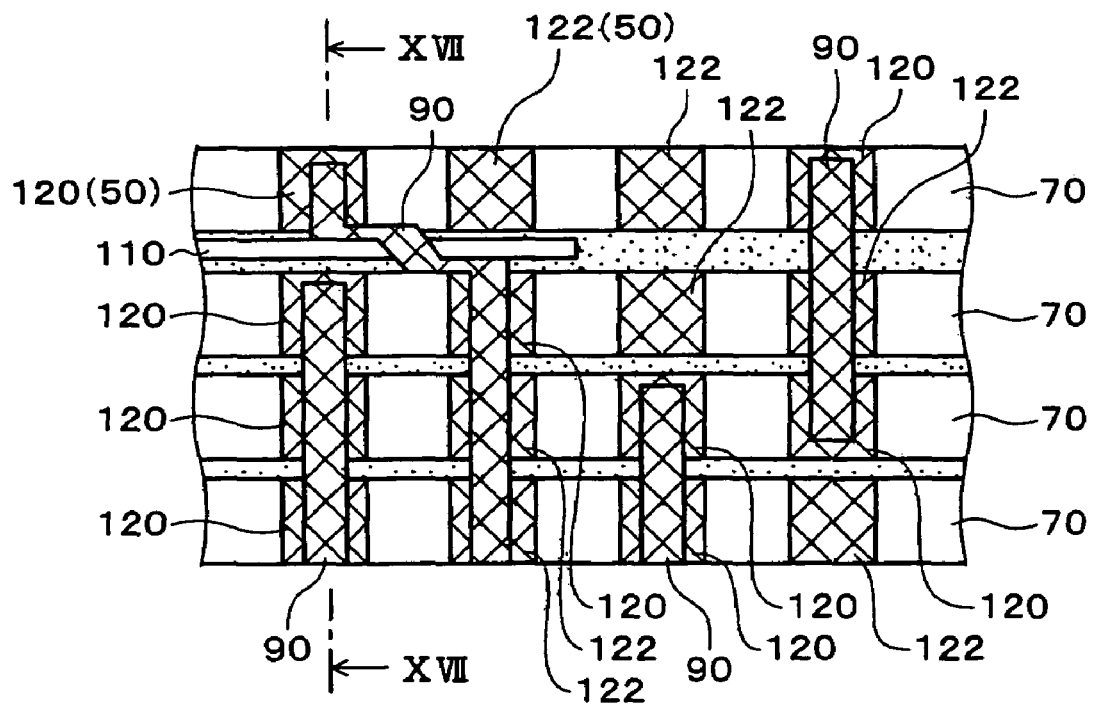
FIG. 18 is another diagram showing a third modification of the semiconductor device according to one embodiment of the present invention.

FIG. 17 is a diagram for illustrating a third modification of the semiconductor device according to this embodiment. FIG. 17 is a cross-sectional view taken along the line XVII—XVII of FIG. 18. FIG. 18 is a side view of the semiconductor device. The semiconductor device includes the insulator 110. In the example shown in FIG. 17, the insulator 110 is provided between the semiconductor chip 70 in the uppermost layer and the semiconductor chip 70 in the layer under the uppermost layer. The insulator 110 overlaps a part of the outer circumference of the semiconductor chip 70 (see FIG. 18). The other configuration is the same as that described for the first modification example.

As shown in FIG. 18, the conductive layers 50 are exposed on the side surfaces of the semiconductor chips 70. The conductive layers 50 may be arranged in a plurality of rows and columns. The conductive layers 50 are either a first terminal 120 which is electrically connected with the electrode 14 or a second terminal (dummy terminal) 122 which is not electrically connected with the electrode 14.

The second conductive layer 90 may be formed to extend in the direction of the height of the semiconductor chip 70 (vertical direction in FIG. 18). The second conductive layer 90 electrically connects the conductive layers 50 which overlap each other in the direction of the width of the semiconductor chip 70 (horizontal direction in FIG. 18). In other words, the second conductive layer 90 electrically connects the conductive layers 50 disposed in the same column. In this case, the second conductive layer 90 is formed to connect at least two first terminals 120. As shown in the rightmost column in FIG. 18, the second conductive layer 90 may pass through at least one second terminal 122 between at least two first terminals 120. This makes it unnecessary to route the second conductive layer 90 so as to avoid the second terminal 122, whereby the manufacturing steps can be simplified.

The second conductive layer 90 may have a section which extends in the direction of the width of the semiconductor chip 70. The second conductive layer 90 electrically connects the conductive layers 50 which do not overlap each other in the direction of the width of the semiconductor chip 70. In other words, the second conductive layer 90 electrically connects the conductive layers 50 disposed in different columns (adjacent columns in FIG. 18; one or a plurality of columns may be interposed therebetween). In this case, a part of the second conductive layer 90 may be formed on the projecting section 112 of the insulator 110. This prevents occurrence of a short circuit between the second conductive layer 90 and other members (conductive layer 50 to which it is not desired to connect the second conductive layer 90, for example). The second conductive layer 90 may pass through the second terminal 122 disposed in the same row differing from the example shown in FIG. 18.

Figure 19:
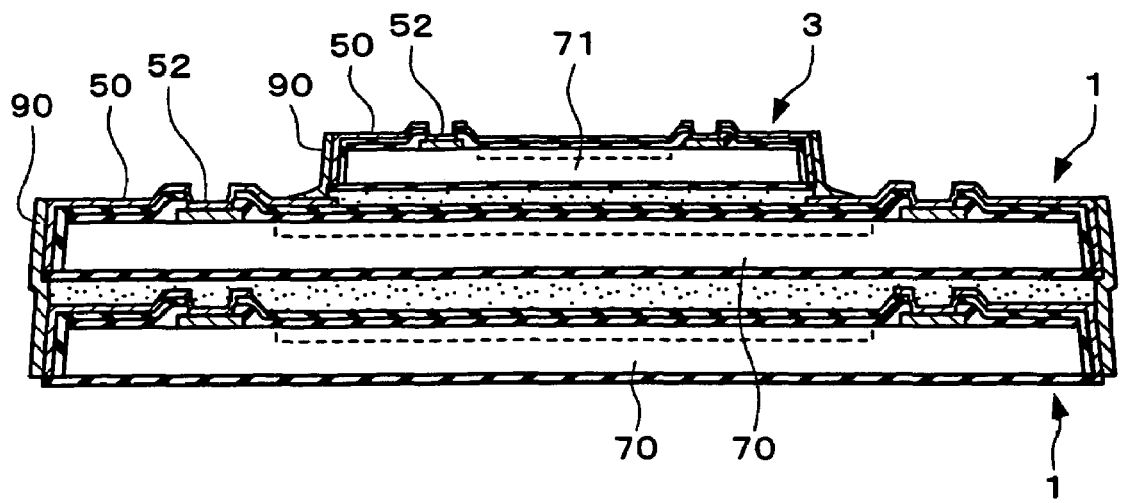
FIG. 19 is a diagram showing a fourth modification of the semiconductor device according to one embodiment of the present invention.
Figure 20:
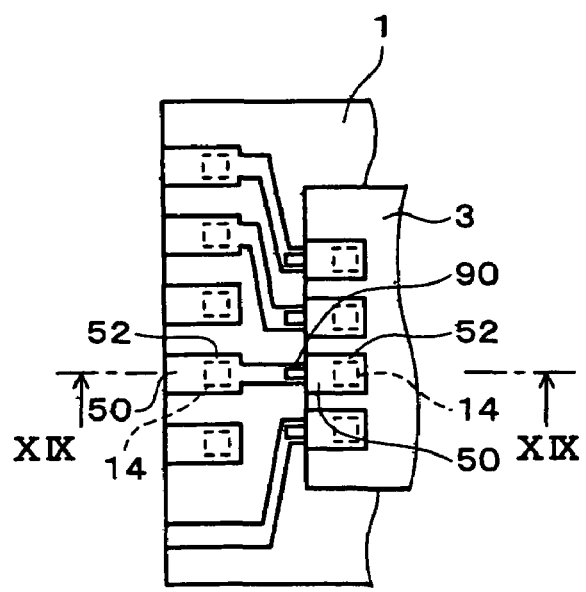
FIG. 20 is another diagram showing a fourth modification of the semiconductor device according to one embodiment of the present invention.

FIG. 19 is a diagram for illustrating a fourth modification of the semiconductor device according to this embodiment. FIG. 19 is a cross-sectional view taken along the line XIX—XIX of FIG. 20. FIG. 20 is a plan view of the semiconductor device. The semiconductor device includes the semiconductor chips 70 (semiconductor devices 1 in more detail (see FIG. 12)), a semiconductor chip 71 (semiconductor device 3 in more detail) having an external size smaller than that of the semiconductor chip 70, and the second conductive layer 90. The other configuration of the semiconductor device 3 is the same as the configuration of the semiconductor device 1. In the example shown in FIG. 19, the semiconductor chips 70 are stacked, and the semiconductor chip 71 is further stacked in the uppermost layer. As shown in FIG. 20, a part of the conductive layer 50 is routed as an interconnect on the surface of the semiconductor chip 70 in the layer under the uppermost layer on which the electrodes 14 are formed. In this case, the conductive layer 50 may be formed to extend from the electrode 14 formed on the end of the semiconductor chip 70 to the center of the semiconductor chip 70. The semiconductor chip 71 may be stacked at the center of the semiconductor chip 70. The second conductive layer 90 electrically connects the conductive layers 50 of the semiconductor chips 70 and 71.

Figure 21:
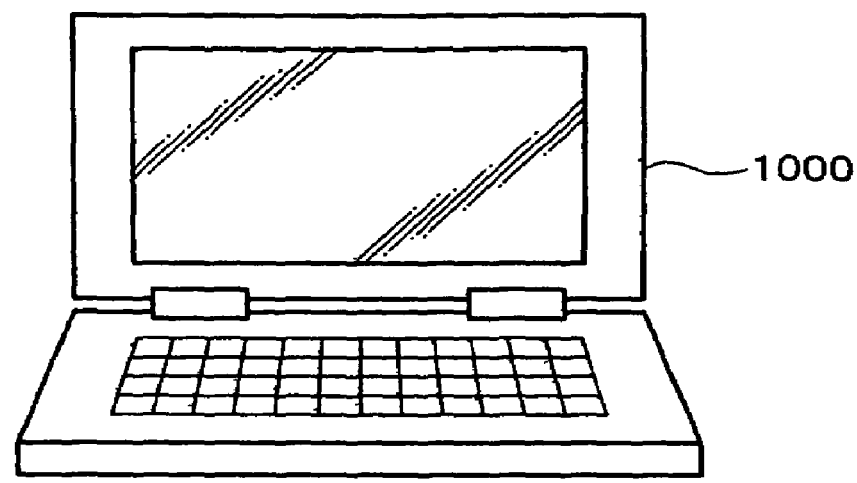
FIG. 21 shows an electronic instrument according to one embodiment of the present invention.
Figure 22:
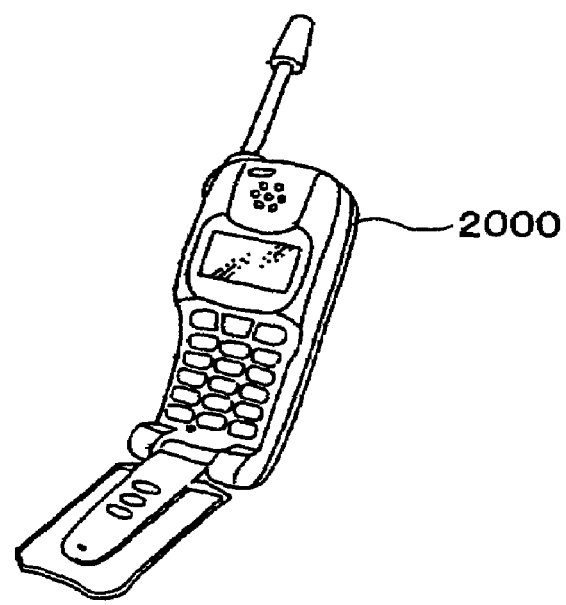
FIG. 22 shows another electronic instrument according to one embodiment of the present invention.

FIGS. 21 and 22 show a notebook-type personal computer 1000 and a portable telephone 2000 as examples of an electronic instrument including the above semiconductor device.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A semiconductor device comprising:
   a plurality of stacked semiconductor chips having top surfaces and side surface, each of the semiconductor chips having an integrated circuit and electrodes;
   insulating layers continuously formed from the top surfaces to the side surfaces;
   first conductive layers formed on the insulating layers above the side surfaces, the first conductive layers arranged in row and columns, each of the rows of the first conductive layers arranged in a width direction of each of the side surfaces, each of the columns of the first conductive layers arranged in thickness direction of the stacked semiconductor chips; and
   a second conductive layer electrically connecting one of the first conductive layers of one of the semiconductor chips to one of the first conductive layers of another one of the semiconductor chips, the second conductive layer having two portions positioned above two of the side surfaces of two of the semiconductor chips, the two portions positioned on two of the first conductive layers arranged in different rows and different columns,
   wherein the second conductive layer has a third portion to connect the two portions in order to electrically connect the two of the first conductive layers.

2. The semiconductor device as defined in claim 1,
   further comprising an insulator provided between the semiconductor chips, the insulator projecting from the side surfaces of the semiconductor chips,
   wherein the third portion of the second conductive layer is formed on the projecting portion of the insulator.

3. A semiconductor device comprising:
   a plurality of stacked semiconductor chips, each of which has a first surface on which an integrated circuit and electrodes are formed;
   an insulating layer continuously formed from the first surface to a side surface of each of the semiconductor chips;
   a first conductive layer formed on the insulating layer on the side surface of each of the semiconductor chips; and
   a second conductive layer electrically connecting the first conductive layer of one of the semiconductor chips to the first conductive layer of another one of the semiconductor chips,
   wherein the second conductive layer is formed on the side surface of at least one of the semiconductor chips;
   wherein the first conductive layer is put in the insulating layer to have its surface level with a surface of the insulating layer.

4. A semiconductor device comprising:
   a plurality of stacked semiconductor chips, each of which has a first surface on which an integrated circuit and electrodes are formed;
   an insulating layer continuously formed from the first surface to a side surface of each of the semiconductor chips;
   a first conductive layer formed on the insulating layer on the side surface of each of the semiconductor chins; and
   a second conductive layer electrically connecting the first conductive layer of one of the semiconductor chins to the first conductive layer of another one of the semiconductor chips,
   wherein the second conductive layer is formed on the side surface of at least one of the semiconductor chips,
   wherein the first conductive layer is put in the insulating layer to have its surface depressed in a surface of the insulating layer.

* * * * *